United States Patent
Jeon

(10) Patent No.: US 8,177,992 B2
(45) Date of Patent: May 15, 2012

(54) PLASMA ETCHING APPARATUS

(75) Inventor: Bu-Il Jeon, Gyeonggi-Do (KR)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 0 days.

(21) Appl. No.: 12/967,026

(22) Filed: Dec. 13, 2010

(65) Prior Publication Data

US 2011/0079581 A1    Apr. 7, 2011

Related U.S. Application Data

(63) Continuation of application No. 11/460,557, filed on Jul. 27, 2006, now Pat. No. 7,879,187.

(30) Foreign Application Priority Data

Jul. 29, 2005  (KR) .............................. 2005-0069391

(51) Int. Cl.
*C03C 15/00* (2006.01)
*H05H 1/24* (2006.01)
*H01L 21/461* (2006.01)
*H01L 21/469* (2006.01)

(52) U.S. Cl. ............ 216/68; 216/67; 427/569; 438/710; 438/731; 438/758; 438/788

(58) Field of Classification Search .................... 216/67, 216/68; 427/569; 438/710, 731, 758, 788; 118/723 I, 723 IR, 723 AN, 504; 156/345.3, 156/345.48, 345.49; 315/111.51
See application file for complete search history.

(56) References Cited

U.S. PATENT DOCUMENTS

| | | | |
|---|---|---|---|
| 5,384,008 A | 1/1995 | Sinha et al. | |
| 5,710,486 A | 1/1998 | Ye et al. | |
| 5,945,351 A | 8/1999 | Mathuni | |
| 6,149,730 A | 11/2000 | Matsubara et al. | |
| 6,261,406 B1 | 7/2001 | Jurgensen et al. | |
| 6,492,612 B1 | 12/2002 | Taguchi et al. | |
| 2003/0052087 A1 | 3/2003 | Kwon et al. | |
| 2003/0226503 A1 | 12/2003 | Wu et al. | |
| 2004/0040932 A1 | 3/2004 | Inomata et al. | |
| 2005/0173067 A1 | 8/2005 | Lim | |
| 2007/0017898 A1 | 1/2007 | Kumar et al. | |
| 2008/0182412 A1* | 7/2008 | Bailey, III et al. ............ 438/689 |

FOREIGN PATENT DOCUMENTS

| | | |
|---|---|---|
| CN | 1481207 | 3/2004 |
| EP | 0840350 A2 | 6/1998 |
| JP | 08-279494 | 10/1996 |
| JP | 10-056006 | 2/1998 |

(Continued)

*Primary Examiner* — Luz L. Alejandro
(74) *Attorney, Agent, or Firm* — Hosoon Lee

(57) ABSTRACT

In one embodiment, a method of removing film materials on an edge area of a substrate in a plasma etching apparatus is disclosed. The apparatus includes a chamber, a substrate support, a shield disposed with a gap on the substrate such that plasma is not generated therein while allowing an edge portion of the substrate to be exposed, and an antenna disposed on an outer wall of the chamber to apply plasma-generating power to an area between the edge portion of the substrate and an inner wall of the chamber. The method includes spraying a curtain gas to a space between the shield and the substrate, using a curtain gas passageway; and spraying a reaction gas to an area between a side surface of the shield and an inner sidewall of the chamber formed within the shield, using a reaction gas supply passageway.

17 Claims, 6 Drawing Sheets

FOREIGN PATENT DOCUMENTS

| | | |
|---|---|---|
| JP | 10-241895 | 9/1998 |
| JP | 2001525492 A | 12/2001 |
| JP | 2004-235607 | 8/2004 |
| JP | 2004-241437 | 8/2004 |
| KR | 10-2002-0080955 | 10/2002 |
| KR | 1020020080955 A | 10/2002 |
| WO | 99/28527 | 6/1999 |
| WO | 0003059 A1 | 1/2000 |
| WO | 2004/097919 A1 | 11/2004 |

* cited by examiner

PLASMA ETCHING APPARATUS

CROSS-REFERENCE TO RELATED APPLICATIONS

This application is a Continuation Application of U.S. application Ser. No. 11/460,557, filed Jul. 27, 2006, which claims priority to Korean Patent Applications 2005-0069391 filed on Jul. 29, 2005, the entire contents of which are hereby incorporated by reference.

BACKGROUND

1. Technical Field

The present invention relates to a plasma etching apparatus, and more particularly, to a method of removing film materials on an edge area of a substrate in the plasma etching apparatus.

2. Description of the Related Art

Semiconductor devices and liquid crystal display devices are fabricated on substrates through multiple thin film deposition and etching processes. That is, a thin film is deposited on a substrate, and a portion of the thin film at the center of the substrate is removed through an etching process using an etching mask, thereby forming a device with a desired thin film pattern. However, since a thin film is formed over the entire surface of the substrate upon deposition of the thin film and an etching process targets on a portion of the thin film at the center of the substrate, portions of the thin film in an edge area of the substrate remain un-removed. In addition, during the etching process, particles or the like are likely accumulated in the edge area of the substrate. In a case where subsequent processes are carried out without removing the thin film or accumulated particles in the edge area of the substrate, many problems may occur, for example, the substrate may be distorted, or the alignment of the substrate may not be easily achieved.

Therefore, in order to perform etching for an edge area of a substrate, many attempts have been actively made to develop an apparatus in which only the edge area of the substrate are caused to be exposed and only the exposed edge area can be etched.

The thin film and the particles in the edge area of the substrate can be removed through a wet- or dry-etching process. In case of the wet-etching process, it is difficult to locally remove the thin film and the particles only in the edge area of the substrate due to difficulty in controlling the process. In addition, the use of various chemicals leads to an increase in production costs and causes environmental problems such as wastewater treatment.

On the other hand, in case of the dry-etching process, plasma is used to remove the thin film or the particles in the edge area of the substrate. This process has advantages in that the above problems with the wet-etching process can be solved.

Here, plasma refers to ionized gas that is composed of ions, electrons, radicals and the like. This plasma is generated at an ultra-high temperature, a strong electric field, or a high frequency electromagnetic field. In particular, the generation of plasma through glow discharging is achieved by free electrons excited under a direct current or a high-frequency electromagnetic field. The excited free electrons collide with gas molecules to produce an active group such as ions, radicals, and electrons. This active group physically and chemically affects the surface of a material, thereby changing the characteristics of the surface.

In an etching apparatus using such plasma, glow discharging occurs inside a container with a process gas therein to generate plasma that in turn is used to etch a work piece such as a substrate.

A conventional plasma etching apparatus for etching an edge area of a substrate using plasma is disclosed in Korean Patent Publication No. 10-0433008. In this patent, the diameter of a stage is made less than that of a wafer. The spacing between the stage and an insulator is established to be closer than the spacing between a cathode ring and an anode ring. The anode ring is installed at an outer periphery of the insulator. Concentrically installed on the outer periphery of the anode ring is a view ring that has an edge extending to be close to the cathode ring, such that the view ring can shield the surrounding of the stage except for a predetermined gap defined in-between with an outer peripheral surface of the cathode ring. An RF output terminal is connected to the cathode ring.

As described above, the cathode ring and the anode ring are installed at the stage with a diameter less than that of a wafer and the outer periphery of the insulator, respectively, and plasma is generated through discharging between the cathode ring and the anode ring. The view ring is installed around the cathode ring such that plasma can reach a bottom surface of an edge of the wafer, thereby performing plasma etching to the bottom surface of the edge of the wafer.

However, since a conventional plasma etching apparatus for etching an edge area of a substrate is a capacitive coupled plasma (CCP) type, wherein plasma is generated through discharging between two opposite electrodes, the apparatus has a disadvantage in that an etching rate is deteriorated due to lower density of plasma. In addition, since the electrodes are attached to the stage and the outer periphery of the insulator and plasma is generated under a high pressure, there is a problem in that in a case where the conventional apparatus is used to etch an edge area of the wafer, the plasma is spread to a central area of the wafer, so that a pattern at the central area thereof may be affected or damaged.

In addition, gases produced during the etching process cannot be smoothly exhausted from spaces defined by the cathode ring, the anode ring and the view ring. Thus, there is a problem in that particles generated during etching cannot be effectively removed and thus may be accumulated at a lower portion of the substrate.

SUMMARY

In one embodiment, a method of removing film materials on an edge area of a substrate in a plasma etching apparatus is disclosed. The apparatus includes a chamber, a substrate support, a shield disposed with a gap on the substrate such that plasma is not generated therein while allowing an edge portion of a substrate to be exposed to remove film materials on an edge area of the substrate, and an antenna disposed on an outer wall of the chamber to apply plasma-generating power to an area between the edge portion of the substrate and an inner wall of the chamber. The method includes spraying a curtain gas to a space between the shield and the substrate, using a curtain gas passageway; and spraying a reaction gas to an area between a side surface of the shield and an inner sidewall of the chamber formed within the shield, using a reaction gas supply passageway.

According to an aspect of the present invention, there is provided a plasma etching apparatus, comprising a chamber; a substrate support disposed inside the chamber to support a substrate; a shield disposed above a center portion of the substrate with a gap such that plasma is not generated between the shield and the center portion of the substrate; an antenna disposed at a position on an outer wall of the chamber to apply plasma-generating power to an area between the edge portion of the substrate and an inner wall of the chamber; and a bias-applying unit for applying bias to the substrate support.

Here, the substrate support may have the same diameter as the shield and allow a bottom-side region of the edge portion of the substrate to be exposed. At this time, the exposed topside and bottom-side regions of the edge portion of the substrate preferably have a width of 1 to 4 mm.

A driving unit is preferably installed below the substrate support to lift or lower the substrate support. A curtain gas passageway for spraying a curtain gas to a space between the shield and the substrate, and a reaction gas supply passageway and a gas injection nozzle for spraying a reaction gas to an area between a side surface of the shield and an inner sidewall of the chamber may be formed within the shield.

The antenna is preferably disposed in the form of a circular strip or in a spiral form in a region on a top or bottom wall of the chamber between an inner sidewall of the chamber and the shield, or on an outer sidewall of the chamber.

A curtain gas passageway for spraying a curtain gas to a space between the shield and the substrate may be installed within side the shield, and a reaction gas supply means may be installed to supply a reaction gas through an outer wall of the chamber.

The bias-applying unit and the antenna may use a common power source, a first matching circuit may be connected between the common power source and the bias-applying unit, and a second matching circuit may be connected between the common power source and the antenna.

An insulation material is preferably provided on an inner surface of a wall of the chamber where the antenna is installed.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION

Figure 1:
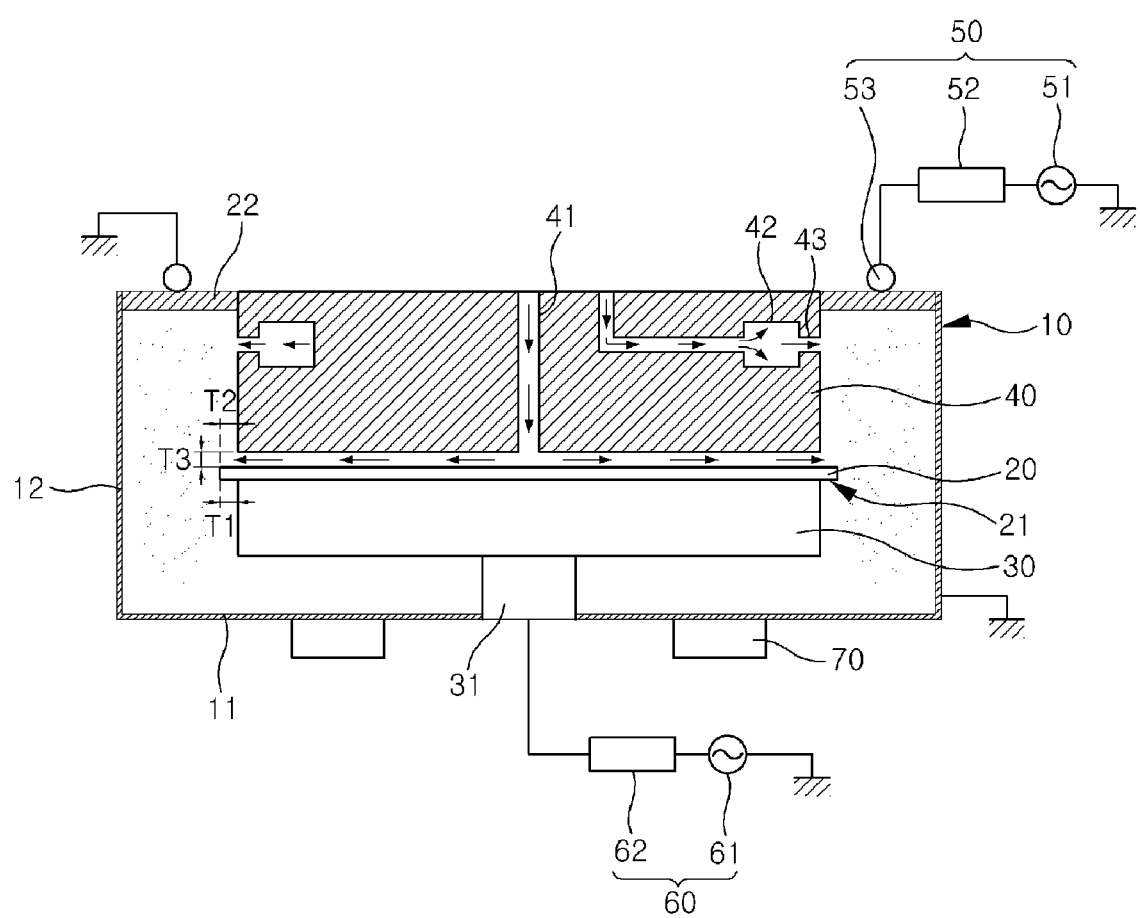
FIG. 1 is a sectional view conceptually showing a plasma etching apparatus according to an embodiment of the present invention.

Hereinafter, a preferred embodiment of the present invention will be described in detail with reference to the accompanying drawings. However, the present invention is not limited to the embodiment but may be implemented into different forms. These embodiments are provided only for illustrative purposes and for full understanding of the scope of the present invention by those skilled in the art. Throughout the drawings, like elements are designated by like reference numerals.

Figure 2:
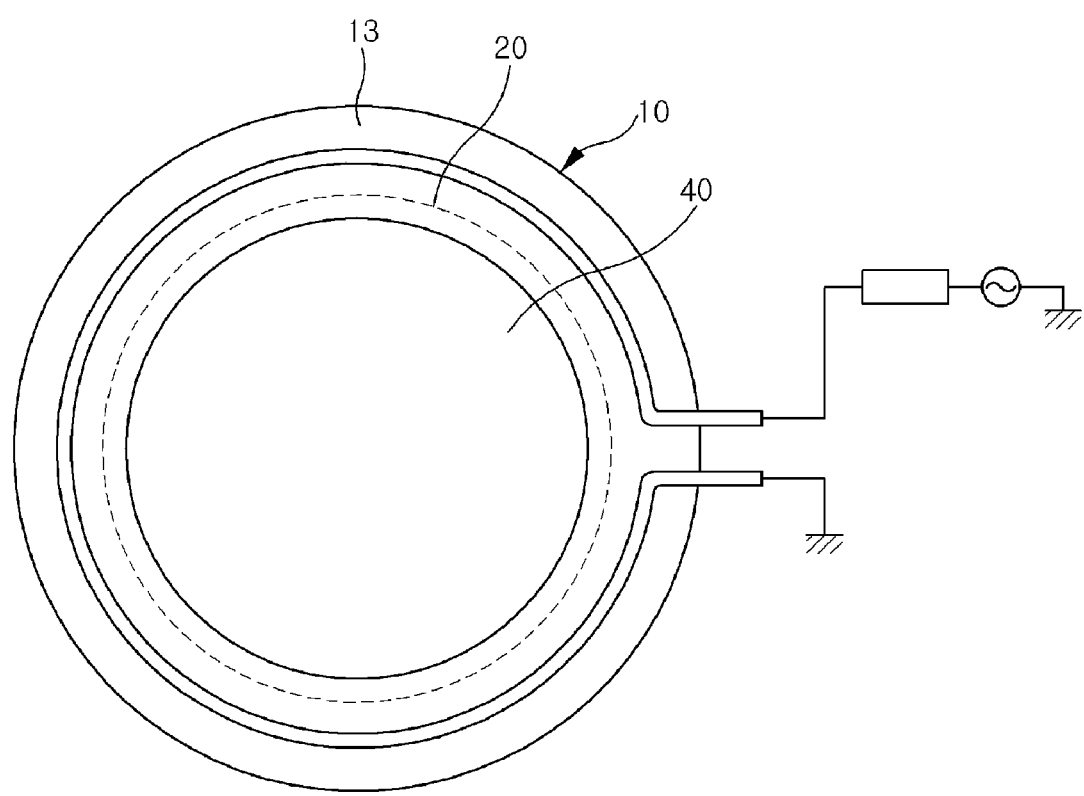
FIG. 2 is a plan view of the plasma etching apparatus according to the embodiment.

FIG. 1 is a sectional view conceptually showing a plasma etching apparatus according to an embodiment of the present invention. FIG. 2 is a plan view of the plasma etching apparatus according to the embodiment.

Referring to FIGS. 1 and 2, the plasma etching apparatus of this embodiment comprises a chamber 10, a substrate support 30 on which a substrate 20 is seated, a shield 40 for preventing plasma from being generated in a region of a top surface of the substrate 20 except an edge portion 21 thereof, a plasma-generating unit 50 for generating plasma at the edge portion 21 of the substrate 20, and a bias-applying unit 60 for applying bias to the substrate support 30.

The plasma etching apparatus of this embodiment further comprises an exhausting unit 70 for exhausting gases and reaction by-products such as pm1icles, which may be produced 20 during an etching process.

In addition, a substrate entrance/exit (not shown) is formed at one side of the chamber. A driving unit 31 is further provided below the substrate support 30 such that the substrate support 30 is lifted or lowered to facilitate loading or unloading of the substrate. An additional lift pin may be installed inside the substrate support 30. That is, after the substrate support 30 is lowered by means of the driving unit 31, the substrate 20 is loaded through the substrate entrance/exit. Thereafter, the substrate support 30 is lifted again and the loaded substrate 20 is then seated on the substrate support 30, thereby facilitating the loading of the substrate 20. Furthermore, the spacing between the substrate 20 and the shield 40 may be adjusted through the lifting operation of the driving unit 31. The substrate support 30 is formed to take the shape of a circular plate with a diameter less than that of the substrate 20. A central portion of the bottom of the substrate 20 comes into close contact with the substrate support 30. Thus, the edge portion 21 of the bottom of the substrate 20 is exposed due to the size of the substrate support 30. The substrate support 30 has the same diameter as the shield 40 and thus the edge portion 21 is equally exposed at the top and bottom of the substrate 20. That is, the topside region and the bottom-side region of the edge portion 21 (T1 in FIG. 1), which are exposed due to the size of the substrate support 30, preferably have a width of 1 to 4 mm from an outer periphery of the substrate 20. Thus, a space for use in generating plasma is provided between the edge portion 21 of the substrate 20 and an inner sidewall 12 of the chamber 10. It is preferred that the substrate support 30 be formed of a conductive material, so that the substrate support 30 can receive external bias and apply bias power to the substrate 20. Although the substrate support 30 and the shield 40 are formed to have the same diameter in the above, they are not limited thereto. For example, the substrate support 30 may be formed to have a diameter less than that of the shield 40.

The shield 40 is formed to take the shape of a circular plate or a cylinder with a diameter less than that of the substrate 20. The shield 40 is configured to shield an area at the central portion of the top surface of the substrate 20 where a pattern will be formed and to expose the topside region of the edge portion 21 of the substrate 20. That is, using a principle in which plasma is not generated within a constant gap in plasma discharging, the shield 40 is configured such that the spacing between the substrate 20 and the shield 40 is a constant gap in an area except the topside region of the edge portion 21 of the substrate 20. Between the topside region of the edge portion 21 of the substrate 20 and the inner sidewall 12 of the chamber 10 is provided a space for generation of plasma.

Here, the topside region of the edge portion of the substrate 20 (T2 in FIG. 1) indicates an area where a pattern for constructing a device is not formed, and has a width in a range of 1 to 4 mm inward from the outer periphery of the substrate 20. The edge portion of the substrate 20 may be provided with a certain alignment key. Here, it is preferred that the spacing (T3 in FIG. 1) between the substrate 20 and the shield 40 be in a range of 0.1 to 3 mm. In a case where the spacing between the substrate 20 and the shield 40 is smaller than this range, the pattern on the top surface of the substrate 20 may be damaged. In a case where the spacing is larger than this range, plasma may penetrate into or may be generated in a space between the substrate 20 and 30 the shield 40.

As illustrated in FIG. 1, the shield 40 may be formed integrally with or separately from a top wall 13 of the chamber 10. In the case where the shield 40 is separated from the top wall 13, the shield 40 can be moved vertically so that the substrate 20 can be easily loaded and unloaded and the spacing between the substrate 20 and the shield 40 can be conveniently adjusted.

In addition, a plurality of passageways may be formed inside the shield 40 such that an external gas can be supplied into the chamber 10. That is, as shown in FIG. 1, a curtain gas passageway 41 for spraying a curtain gas between the shield 40 and the substrate 20 is included in the shield 40. By spraying the curtain gas through the curtain gas passageway into the space between the shield 40 and the substrate 20, plasma formed beside the shield 40, i.e., at the edge portion 21 of the substrate 20, can be prevented from being introduced into the space between the shield 40 and the substrate 20. Furthermore, the shield includes a reaction gas supply passageway 42 and a gas injection nozzle 43 for supplying a reaction gas to the side of the shield 40, i.e., to an area between the shield 40 and the inner sidewall 12 of the chamber 10. At this time, examples of the reaction gas include Ar, $CF_4$, $SF_6$, $Cl_2$, and the like. A plurality of gas injection nozzles 43 may be formed along the circumference of the circular shield 40.

As described above, the edge portion 21 of the substrate 20 is exposed to a space defined by the inner sidewall 12 of the chamber 10 and the side surfaces of the shield 40 and the substrate support 30. A space sufficient to generate plasma is maintained between the exposed edge portion 21 of the substrate 20 and the top wall 13, the inner sidewall 12 and the bottom wall 11 of the chamber 10.

Plasma is generated at the exposed edge portion 21 of the substrate 20 through the aforementioned plasma-generating unit 50, thereby etching the exposed edge portion of the substrate 20.

To this end, the plasma-generating unit 50 employs an apparatus using inductively coupled plasma (ICP). Thus, the plasma-generating unit 50 comprises a high-frequency power generator 51 for generating high-frequency power, an impedance-matching device 52 for impedance matching of the high-frequency power, and an antenna 53 for receiving impedance matched high-frequency power.

As illustrated in FIG. 2, the antenna 53 is formed to take the shape of a circular band on the top wall 13 of the chamber between the inner sidewall 12 of the chamber 10 and the shield 40. The antenna 53 supplies electric power for generating plasma at the exposed edge portion 21 of the substrate 20. At this time, the antenna 53 may be formed in a spiral form. In the case of using inductively coupled plasma, plasma with high density can be generated in a relatively wider space as compared with the case of capacitive coupled plasma that has been described in the related art section. Thus, the straightness of ions can be improved when they collide with a wafer, thereby improving an etching profile and an etching rate.

It is preferred that a region on the top wall 13 of the chamber 10, where the antenna 53 is disposed, be formed of an insulation material 22. Thus, the high-frequency power is applied to the inside of the chamber 10 through the antenna 53 without loss, thereby generating plasma at the edge portion of the substrate 20. In addition, the sidewall of the chamber 10 except the top wall 13 thereof is grounded.

It will be apparent that the insulation material 22 may not be formed integrally with the top wall 13 but may be inserted into only the region on the top wall 13 where the antenna 53 is disposed. In addition, as illustrated in the figure, an additional insulation material 22 may be formed underneath the top wall 13. Here, the insulation material may include a ceramic material but is not limited thereto.

The bias-applying unit 60 comprises a bias power generator 61 for generating bias power, and an impedance-matching device 62 for matching impedance of the bias power and transmitting it to the substrate support 30. The bias-applying unit 60 transmits the impedance matched bias power to the substrate 20 through the substrate support 30 so that ion energy of plasma is accelerated by means of the bias to improve an etching rate using the plasma.

The operation of the aforementioned plasma etching apparatus will be briefly explained below.

The substrate 20 is loaded on the substrate support 30 placed inside the chamber 10. The distance between the shield 40 and the substrate 20 is adjusted to such an extent that plasma is not generated. Thereafter, while the internal pressure of the chamber 10 is maintained to 50 mTorr to 2 Torr, a reaction gas and a curtain gas are supplied through the shield 40. Impedance-matched plasma-generating power is supplied into the chamber 10 through the antenna 53 disposed on the top wall 13 of the chamber 10. Thus, plasma is generated at the edge portion 21 of the substrate 20, i.e., between the inner sidewall 12 of the chamber 10 and the side surfaces of the shield 40 and the substrate support 30. When a bias voltage is applied to the substrate 20 from the bias-applying unit 60 through the substrate support 30, ions are accelerated and the accelerated ions collide with the edge portion 21 of the substrate 20 to perform etching. After etching, produced particles are easily exhausted through the exhausting unit 70 that is disposed below the substrate support 30. Here, since the curtain gas continues to be sprayed into the space between the shield 40 and the substrate 20, the plasma is not diffused into the space between the shield 40 and the substrate 20. Examples of the curtain gas include $N_2$ or other inert gases.

In this embodiment, the reaction gas may be supplied into the chamber 10 using an additional injection device rather than through the shield 40. It is preferred that the reaction gas supplying means be constructed to supply the reaction gas through an outer wall of the chamber. It will also be apparent that a reaction gas supplying means (not shown) may be disposed in the insulation material 22 that is installed on the top wall 13 of the chamber 10. Accordingly, since the reaction gas supplying means is disposed below the antem 1a through which plasma generating power is applied, plasma can be easily generated.

In addition, the arrangement of an antenna for supplying electric power for generation of plasma, the arrangement of flow-passageways for spraying a curtain gas, and the method of supplying the electric power may be achieved in various manners, which will be described below with reference to the drawings.

Figure 3:
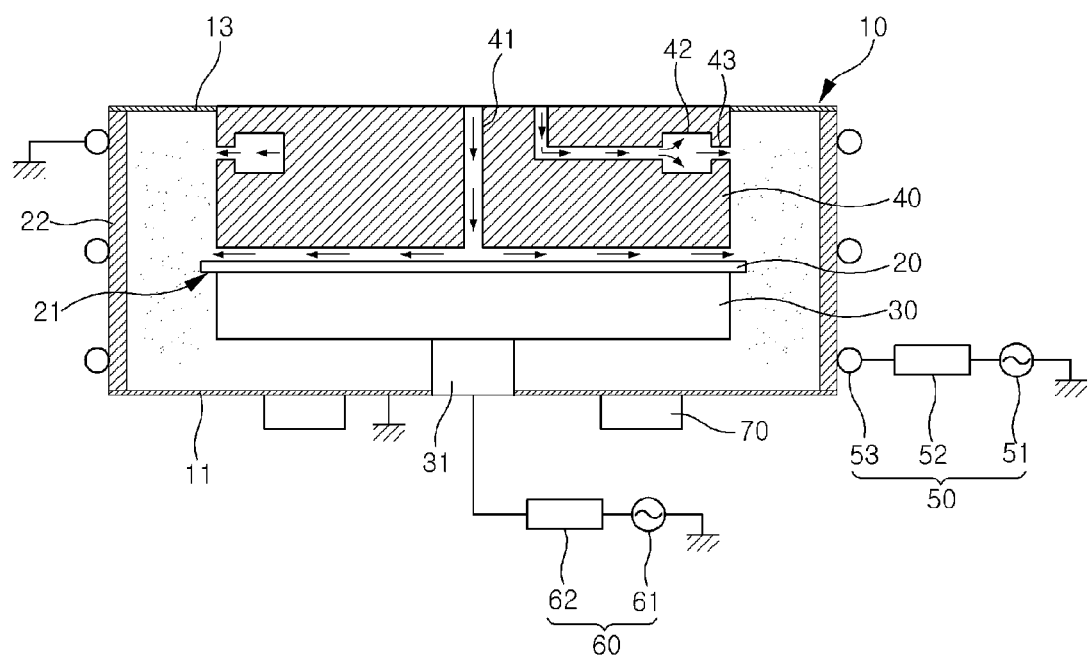
FIGS. 3 to 5 are sectional views conceptually showing modified versions of the plasma etching apparatus according to the embodiment.
Figure 4:
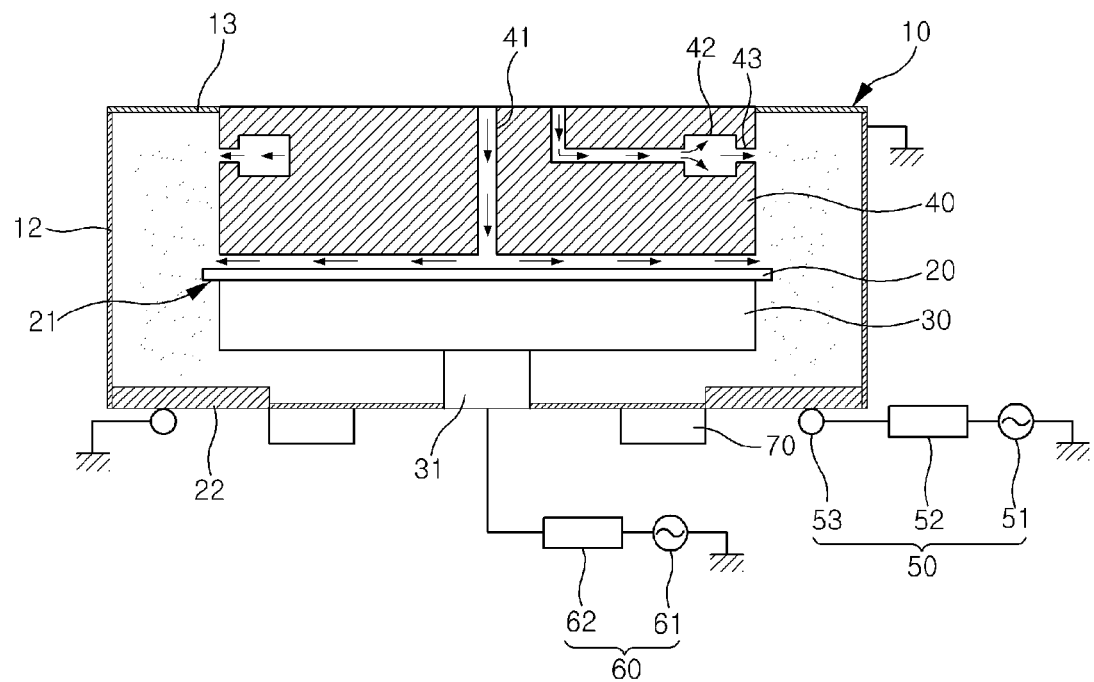
Figure 5:
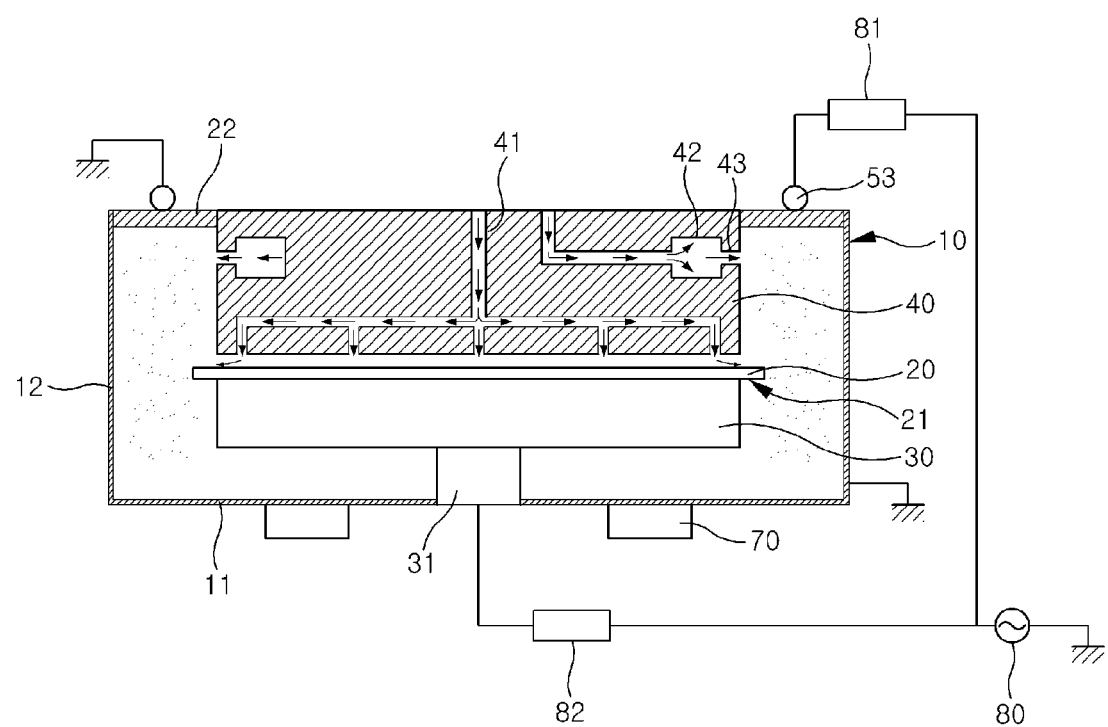
Figure 6:
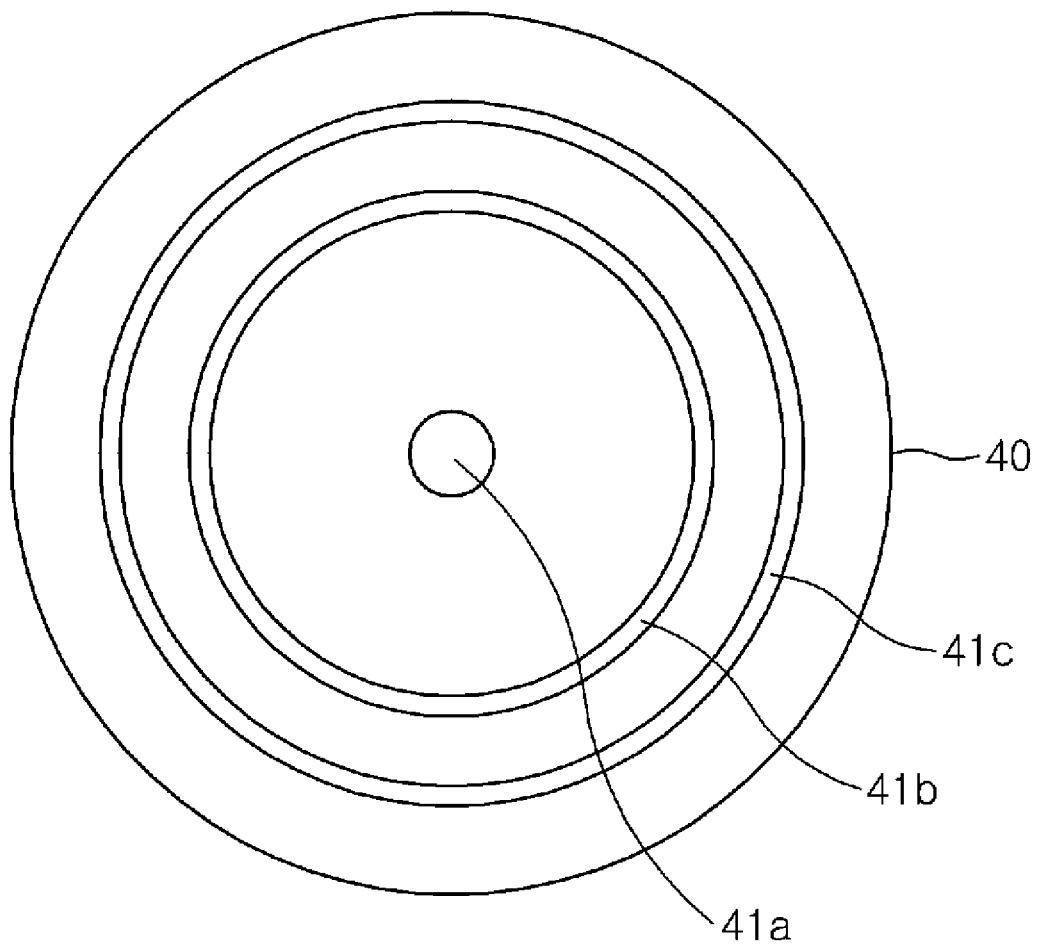
FIG. 6 is a rear view of a shield in the plasma etching apparatus of FIG. 5.

FIGS. 3 to 5 are sectional views conceptually showing modified versions of the plasma-etching apparatus according to the embodiment of the invention. FIG. 6 is a rear view of a shield in the plasma etching apparatus of FIG. 5.

Referring to FIG. 3, the antenna 53 may be arranged in a spiral form to wrap around the outer sidewall 12 of the chamber 10. Plasma-generating power is applied to the antenna 53 disposed on the outer sidewall 12 of the chamber 10 to generate plasma inside the chamber 10. At this time, it is preferred that the insulation material 22 be installed on the outer sidewall 12 of the chamber 10. As illustrated in the figure, the antenna 53 may be installed in such a manner that a single antenna is wrapped several times around the outer sidewall 12 of the chamber 10. Alternatively, one or more antennas each of which is formed to take the shape of a circular strip for wrapping the chamber 10 once may be arranged while being connected to one another in series or in parallel. Other portions of the chamber 10 except the sidewall 12 are grounded. In addition, referring to FIG. 4, the antenna 53 may be formed to take the shape of a circular strip installed on the bottom wall 11 of the chamber 10. At this time, the antenna 53 may be formed in a spiral form. A plasma-generating power source 51 supplies power to the antenna 53 disposed on the bottom wall 11 of the chamber 10 to generate plasma inside the chamber 10. Here, the insulation material 22 is installed on the bottom wall 11 of the chamber 10.

Furthermore, in the case where the antenna 53 is disposed on the bottom wall 11 of the chamber 10, the reaction gas may be supplied through the bottom wall 11 of the chamber 10. The exhausting unit 70 may be disposed at a region on the top wall of the chamber 10 to exhaust particles through the top wall of the chamber 10.

In addition, as illustrated in FIGS. 5 and 6, a curtain gas passageway 41 is formed in the shield 40 to spray a curtain gas into the space between the shield 40 and the substrate 20. As shown in FIG. 6, the curtain gas passageway 41 comprises a first curtain gas passageway 41a formed at the center of the shield 40, a second curtain gas passageway 41c formed at an edge of the shield 40, and a third curtain gas passageway 41b formed between the first and second curtain gas passageways 41a and 41c. Here, spray ports of the second and third curtain gas passageways 41b and 41c are formed to take the shape of a circular strip such that the curtain gas can be sprayed over the entire central portions of the substrate 20. Therefore, plasma generated at the edge portion 21 of the substrate 20 can be prevented from being diffused into the central portion of the substrate 20. The curtain gas passageway 41 is not limited to that described above but may be formed in various manners so long as the plasma can be prevented from being diffused into the central portion of the substrate. Besides the curtain gas passageway, the reaction gas supply passageway 42 and the gas injection nozzle 43 may also comprise a plurality of passageways as described above.

In addition, a single power generator 80 supplies electric power to the antenna 53 to generate plasma between the edge portion 21 of the substrate 20 and the inner sidewall of the chamber and simultaneously supplies electric power to the substrate support 30 to apply bias thereto. That is, a first matching circuit 81 and a second matching circuit 82 are connected to the single power generator 80. The first matching circuit 81 is connected to the antenna 53 and the second matching circuit 82 is connected to the substrate support 30. In this way, the electric power generated from the common power generator 80 is applied to the antenna 53 through the first matching circuit 81 to generate plasma and also applied to the substrate support 30 through the second matching circuit 82 to apply bias to the substrate support 30.

As described above, according to the present invention, the shield and the substrate support prevent plasma from being generated at other portions of a substrate except an edge portion of the substrate. Discharging of inductively coupled plasma is employed to generate plasma with high density, thereby removing a thin film and particles remained at the edge portion of the substrate.

In addition, by means of the discharging of inductively coupled plasma, it is possible to improve an etching rate at the edge portion of the substrate and to appropriately adjust the etched profile at a low processing pressure.

Furthermore, a curtain gas is sprayed to a central region of a top surface of the substrate through the shield, so that plasma is prevented from being introduced into a space between the substrate and the shield.

What is claimed is:
1. A method comprising:
   providing an apparatus comprising:
      a chamber;
      a substrate support disposed inside the chamber to support a substrate;
      a shield disposed above a center portion of the substrate, with a gap such that plasma is not generated between the shield and the center portion of the substrate, to expose an edge portion thereof, and for preventing plasma from being generated above the center portion of the substrate except at the edge portion;
      an antenna disposed at a position on an outer wall of the chamber;
      a bias power applying unit;
      a curtain gas passageway;
      a reaction gas supply passageway; and
      a gas injection nozzle;
   spraying a curtain gas to a space between the shield and the substrate, using the curtain gas passageway;
   spraying a reaction gas to an area between a side surface of the shield and an inner sidewall of the chamber, using the reaction gas supply passageway and the gas injection nozzle which are formed within the shield;
   applying plasma-generating power to an area between the edge portion of the substrate and an inner wall of the chamber, using the antenna; and
   applying bias to the substrate support, using the bias power applying unit.

2. The method as claimed in claim 1, wherein the substrate support has a diameter less than that of the substrate to expose a bottom-side region of the edge portion of the substrate.

3. The method as claimed in claim 1, wherein the substrate support has a same diameter as the shield.

4. The method as claimed in claim 3, wherein the exposed bottom-side region of the edge portion of the substrate by the substrate support has a width of 1 to 4 mm, and an exposed topside region of the edge portion of the substrate by the shield has a width of 1 to 4 mm.

5. The method as claimed in claim 1, wherein the substrate support has a diameter less than that of the shield.

6. The method as claimed in claim 1, wherein the gap between the shield and the center portion of the substrate is in a range of 0.1 to 3 mm.

7. The method as claimed in claim 1, wherein the shield is formed integrally with or separately from a top wall of the chamber.

8. The method as claimed in claim 1, wherein the shield is spaced apart from the edge portion of the substrate.

9. The method as claimed in claim 1, wherein the curtain gas passageway is formed at a center of the shield.

10. The method as claimed in claim 9, wherein the curtain gas passageway comprises a first curtain gas passageway formed at the center of the shield, a second curtain gas passageway formed at an edge of the shield, and a third curtain gas passageway formed between the first curtain gas passageway and the second curtain gas passageway.

11. The method as claimed in claim 10, wherein the second and the third curtain gas passageway form concentric circles.

12. The method as claimed in claim 1, wherein the reaction gas supply passageway is separately formed from the curtain gas passageway.

13. The method as claimed in claim 12, wherein the gas injection nozzle is formed at a side surface of the shield.

14. The method as claimed in claim 1, wherein a driving unit is installed below the substrate.

15. The method as claimed in claim 1, wherein the antenna is disposed in a form of a circular strip or in a spiral form in a region on a top or bottom wall of the chamber between an inner sidewall of the chamber and the shield, or on an outer sidewall of the chamber.

16. The method as claimed in claim 1, wherein the bias-applying unit and the antenna use a common power source, a first matching circuit is connected between the common power source and the bias-applying unit; and a second matching circuit is connected between the common power source and the antenna.

17. The method as claimed in claim 1, wherein an insulation material is provided on an inner surface of a wall of the chamber where the antenna is installed.

* * * * *